United States Patent [19]

Kim

[11] Patent Number: 5,741,728

[45] Date of Patent: Apr. 21, 1998

[54] METHOD FOR MANUFACTURING CHARGE-COUPLED DEVICE WITH POLYGATES HAVING THE SAME RESISTANCES

[75] Inventor: Yong Kwan Kim, Chungcheongbuk-do, Rep. of Korea

[73] Assignee: LG Semicon Co., Ltd., Chungcheongbuk-do, Rep. of Korea

[21] Appl. No.: 696,150

[22] Filed: Aug. 13, 1996

[30] Foreign Application Priority Data

May 16, 1996 [KR] Rep. of Korea ................ 16466/1996

[51] Int. Cl.$^6$ ................................................ H01L 21/339
[52] U.S. Cl. ............................................. 438/75; 438/587
[58] Field of Search ................................ 438/60, 75, 144, 438/145, 148, 587, 588

[56] References Cited

U.S. PATENT DOCUMENTS

| | | | |
|---|---|---|---|
| 4,766,089 | 8/1988 | Davids et al. | 438/587 |
| 5,485,207 | 1/1996 | Nam | 438/60 |
| 5,510,285 | 4/1996 | Kim | 438/75 |
| 5,578,511 | 11/1996 | Son | 438/76 |

*Primary Examiner*—Chandra Chaudhari

[57] ABSTRACT

A method for manufacturing a charge-coupled device in which the resistances of the respective poly-gates are made to be the same to thereby enhance the charge transfer efficiency, is disclosed including the steps of forming a first semiconductor layer on a substrate; implanting an impurity ion having a first concentration on the first semiconductor layer; patterning the first semiconductor layer to form a plurality of first gate electrode lines having a first width and spaced apart by a constant distance; forming a second semiconductor layer on the first gate electrode line and the exposed entire surface of the substrate; implanting an impurity ion having a second concentration on the second semiconductor layer; and patterning the second semiconductor layer to form second gate electrode lines having a second width between the first gate electrode lines.

12 Claims, 5 Drawing Sheets

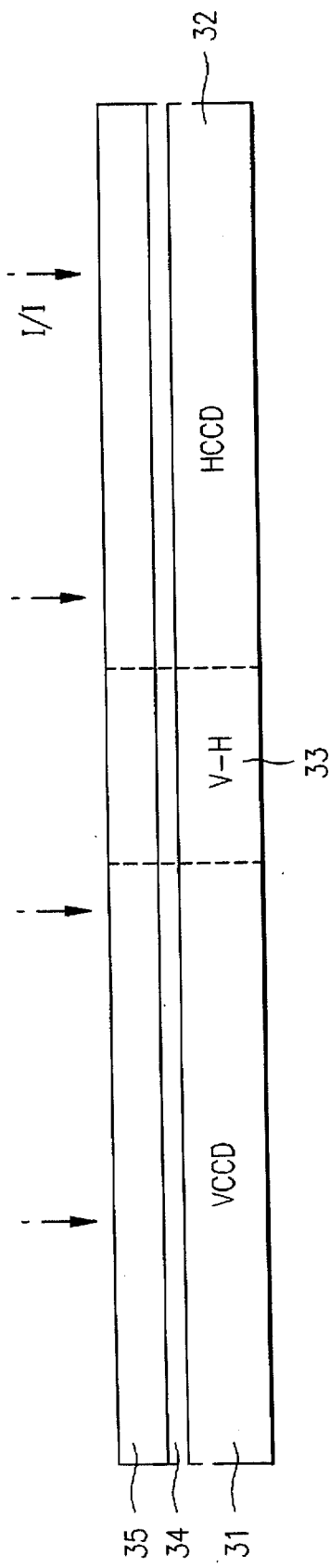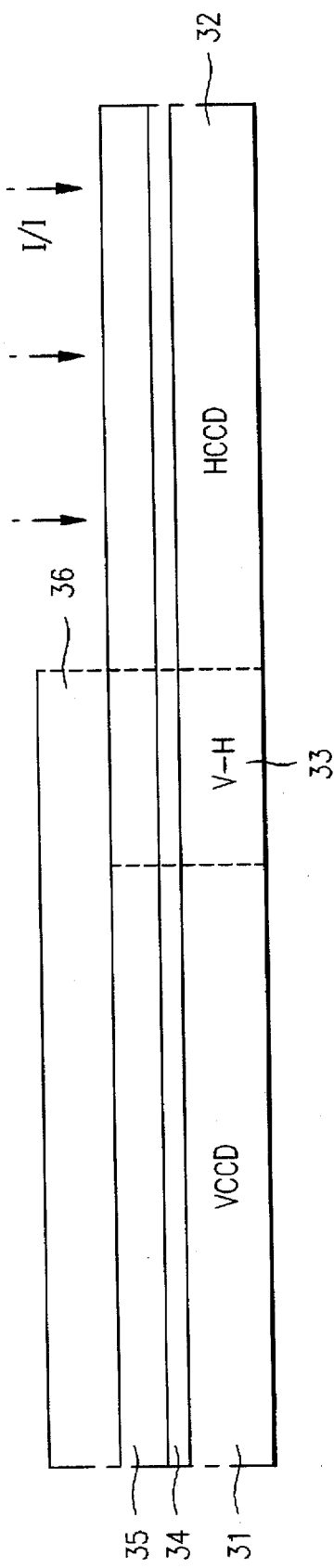

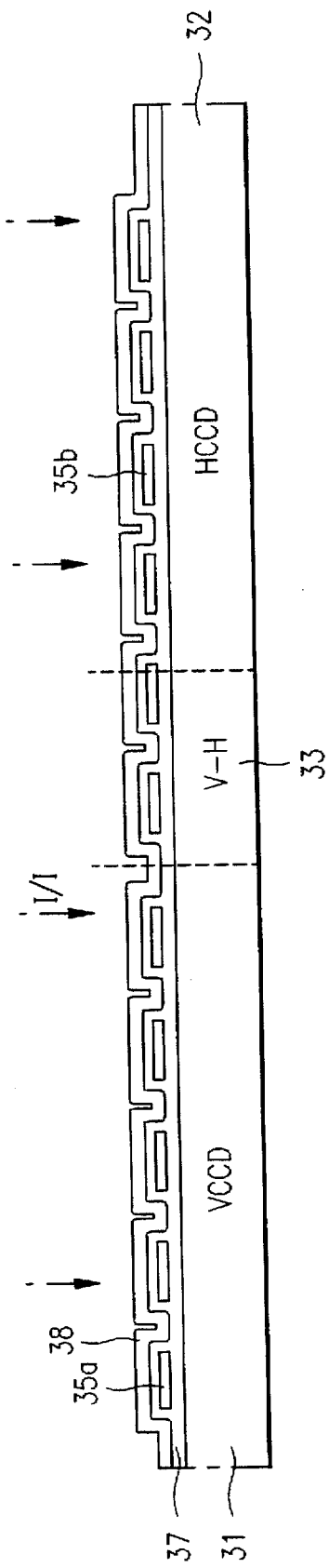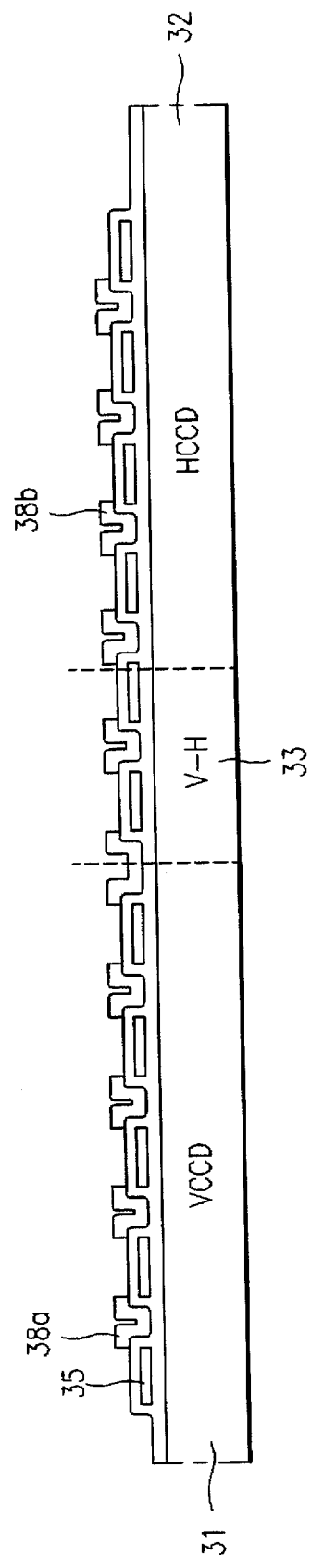

METHOD FOR MANUFACTURING CHARGE-COUPLED DEVICE WITH POLYGATES HAVING THE SAME RESISTANCES

BACKGROUND OF THE INVENTION

The present invention relates to a charge-coupled device, and more particularly, to a method for manufacturing a charge-coupled device which is suitable to enhance the charge transfer efficiency.

In general, a charge-coupled device is composed of a plurality of photodiodes (PDs) arranged of a matrix type and generating the image of light type as electrical signal charges, a plurality of vertical charge-coupled device (VCCD) region transferring the image signal charges generated from the photodiodes (PD) in the vertical direction, a horizontal charge-coupled device (HCCD) region formed on output terminal of the VCCD region and transferring the image signal charge transferred from the VCCD region to the output terminal in the horizontal direction, and a sensing amp formed on the output terminal of the HCCD region, sensing the transferred image signal charge and generating it as the electrical signal.

Hereinafter, a conventional charge-coupled device will be described with reference to the attached drawings.

FIG. 1a is a layout diagram of the conventional charge-coupled device. FIG. 1b is a cross-sectional view taken along line A-A' of FIG. 1a.

To begin with, as shown in FIG.1a, a substrate of P-conductivity type is prepared. In the surface of the substrate, a plurality of photodiodes (PDs), a plurality of vertical charge-coupled device (VCCD) regions transferring image signal charges generated from each photodiode in the vertical direction, and one horizontal charge-coupled device (HCCD) region formed on the output terminal of the VCCD regions. Further, a plurality of gates are formed on the substrate, as follows.

On the VCCD regions, a plurality of first vertical poly-gates 1 and second vertical poly-gates 2 for sequentially transferring the image signal charges generated from each photodiodes to the output terminal are formed repeatedly.

At this time, each second vertical poly-gate 2 is composed so that one side thereof is partially overlapped with the photodiodes of the corresponding line, thereby serving as a transfer gate. That is, this plays a role of transferring the image signal charges generated the photodiodes to the VCCD regions.

To the first and second vertical poly-gates 1 and 2 formed repeatedly on the VCCD regions as described above, the vertical clock signals (V$\phi$1, V$\phi$2, V$\phi$3, V$\phi$4) are alternately applied, thereby sequentially transferring the image signal charges in the vertical direction. That is, the transfer operation of the image signal charges is accomplished by means of 4-phase clocking.

On the HCCD region, there are formed first and second horizontal poly-gates 1a and 2a for converting the image signal charges transferred from the VCCD regions into the electric image signals and for transferring these signals to the sensing amp.

To a plurality of first and second horizontal poly-gate 1a and 2a, the clocks of H$\phi$1 and H$\phi$2 are alternately applied to sequentially transfer the image signal charges.

In the conventional charge-coupled device constructed as described above, as shown in FIG.1b, the potential level of the image signal charge generated from each pixel region is varied by the clocks of V$\phi$1, V$\phi$2, V$\phi$3, V$\phi$4, so that the image signal charge is transferred in the vertical direction. Then, this image signal charge is transferred to a floating gate region by the clocks of H$\phi$1 and H$\phi$2, converted into the analog signal through the sensing amp and generated.

At this time, in order to transfer the image signal charges of the photodiodes to the VCCD regions, the high voltage is applied to the transfer gate.

FIG.1b is a cross-sectional view taken along line A-A' of FIG.1a and shows that the width of the first vertical poly-gate and the width of the second vertical poly-gate are different from each other.

That is, as shown in FIG.1b, since the widths of first vertical poly-gate 1 and second vertical poly-gate 2 are different from each other, if the doping concentrations of first vertical poly-gate 1 and second vertical poly-gate 2 are the same, the resistance of first vertical poly-gate 1 becomes different from that of second vertical poly-gate 1.

In other words, if the doping concentrations are the same, first vertical poly-gate 1 having the width wider than that of second vertical poly-gate 2 has the resistance value lower than that of second vertical poly-gate 2.

At this time, since the widths of first vertical poly-gate 1a and second vertical poly-gate 2a are patterned equally on the HCCD region, if the impurity doping concentrations are the same, it is little worth consideration.

However, in the manufacturing method of the above conventional charge-coupled device, since the first vertical poly-gate and the second vertical poly-gate have the same doping concentration in spite of the different pattern widths, the resistance values of the first and second vertical poly-gates become different from each other. Due to this, the charge transfer efficiency (CTE) of the VCCD regions is reduced.

SUMMARY OF THE INVENTION

In order to solve the aforementioned problems, it is an object of the present invention to provide a method for manufacturing a charge-coupled device in which the doping concentrations of first and second vertical poly-gates are different from each other due to the pattern widths thereof to thereby equalize the resistance values thereof, and thus, the charge transfer efficiency is enhanced.

To accomplish the object of the present invention, there is provided a method for manufacturing a charge-coupled device, comprising the steps of forming a first semiconductor layer on a substrate; implanting an impurity ion having a first concentration on the first semiconductor layer; patterning the first semiconductor layer to form a plurality of first gate electrode lines having a first width and spaced apart by a constant distance; forming a second semiconductor layer on the first gate electrode line and the exposed entire surface of the substrate; implanting an impurity ion having a second concentration on the second semiconductor layer; and patterning the second semiconductor layer to form second gate electrode lines having a second width between the first gate electrode lines.

At this time, in case that the widths of the first and second gate electrode lines are the same respectively, the doping concentrations of the impurities are made to be the same.

Further, the doping concentration of the impurity is controlled by selectively performing the impurity implantation. The impurity doping concentration of the gate electrode lines having a wide width is higher than that of the gate electrode lines having a narrow width.

The first width is narrower than the second width. The first concentration is smaller than the second concentration.

Meanwhile, in order to insulate the substrate and the first gate electrode lines from each other, a first insulating layer is formed. A second insulating layer is formed in order to insulate the first gate electrode lines and the second gate electrode lines from each other.

BRIEF DESCRIPTION OF THE ATTACHED DRAWINGS

FIG.2 is a cross-sectional view taken along line B-B' of FIG.1a; and

FIGS.3a to 3d are cross-sectional views for illustrating a method for manufacturing a charge-coupled device of the present invention, taken along line B-B' of FIG.1a.

DETAILED DESCRIPTION OF THE INVENTION

Hereinafter, a method for manufacturing a charge-coupled device of the present invention will be described with reference to the attached drawings.

Figure 1A:
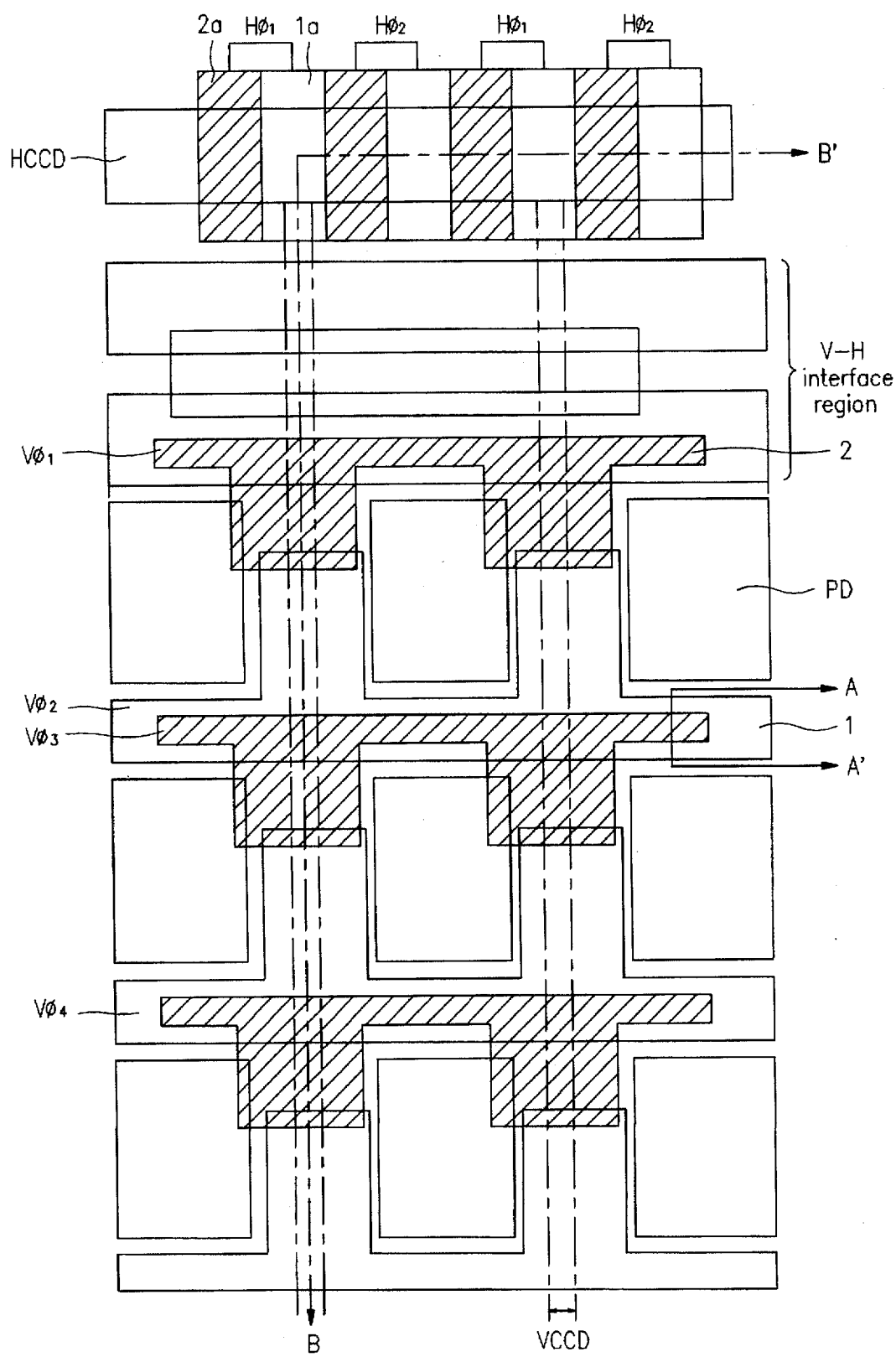
FIG.1a is a layout diagram of a conventional charge-coupled device.
Figure 1B:
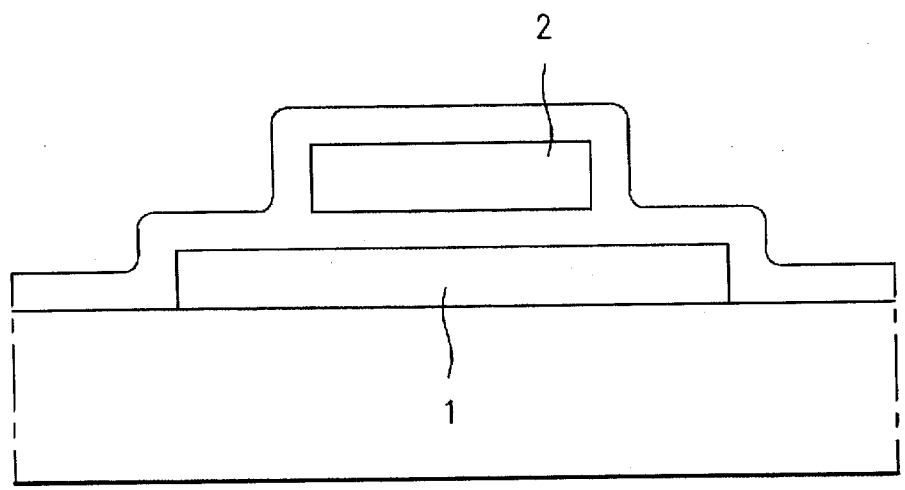
FIG.1b is a cross-sectional view taken along line A-A'.
Figure 2:
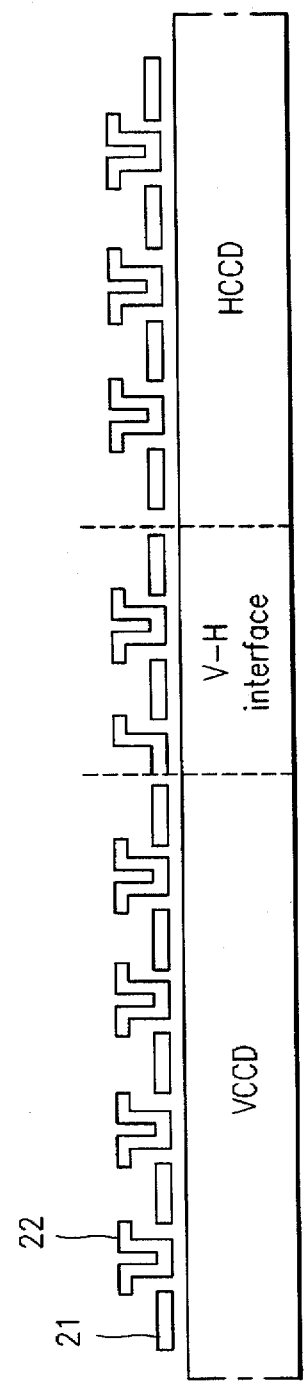

FIG.2 is a cross-sectional view taken along line B-B' of FIG.1, and shows a VCCD region, a HCCD region, and a first poly-gate 21 and a second poly-gate 22 formed on the interface region of the VCCD-HCCD.

FIGS.3a to 3d are cross-sectional views for illustrating a method for manufacturing a charge-coupled device of the present invention, taken along line B-B' of FIG.1.

That is, a method for manufacturing a charge-coupled device of the present invention comprises the steps of forming a plurality of VCCD regions, a HCCD region and the interface region between the VCCD-HCCD regions in the surface of a substrate; forming a first insulating layer and a first semiconductor layer on the entire surface of the substrate; performing the first implant doping on the entire surface of the first semiconductor layer; performing the second impurity doping only on the first semiconductor layer corresponding to the HCCD region and patterning the first semiconductor layer to form a plurality of first vertical gate electrode lines and a plurality of first horizontal gate electrode lines; forming a second insulating layer and a second semiconductor layer on the first insulating layer and the exposed surface of the gate electrode lines and performing the third impurity doping; and patterning the second semiconductor layer to form second vertical gate electrode lines having a width wider than that of the first vertical gate lines between the first gate electrode lines and second horizontal gate electrode lines between the first horizontal gate electrode lines.

This will be described below, in detail, with reference to FIGS.3a to 3d.

As shown in FIG.3a, a first insulating layer 34 is formed on a substrate in which a VCCD region 31, a HCCD region 32 and the interface region between VCCD region 31 and HCCD region 32.

After forming a first semiconductor layer 35 on first insulating layer 34, the first impurity doping is carried out.

At this time, first semiconductor layer 35 serves as a first poly-gate.

As shown in FIG.3b, in the first impurity-doped first semiconductor layer 35, first semiconductor layer 35 of HCCD region 32 is exposed.

At this time, to expose first semiconductor layer 35 on HCCD region 32 is carried out using a barrier mask 36.

The second impurity doping is carried out on exposed first semiconductor layer 35 on HCCD region 32.

Accordingly, the doping concentrations of the impurities implanted in first semiconductor layer 35 on VCCD region 31 and first semiconductor layer 32 on HCCD region 32 are different from each other.

Then, as shown in FIG.3c, after completing the second impurity doping, first semiconductor layer 35 on HCCD region 32 including VCCD region 31 is patterned to form a plurality of first vertical poly-gate lines 35a and a plurality of first horizontal poly-gate lines 35b.

A second insulating layer 37 and a second semiconductor layer 38 are sequentially formed on the entire surface including VCCD region 31 and HCCD region 32.

Then, the third impurity doping is carried out on second semiconductor layer 38.

At this time, second semiconductor layer 38 serves as a second poly-gate line. Further, the doping concentration of the third impurity performed on second semiconductor layer 38 is the same as the sum of the first impurity doping concentration and the second impurity doping concentration.

Accordingly, the impurity doping concentration of first semiconductor layer 35 on HCCD region 32 is the same as that of second semiconductor layer 38 on HCCD region 32. The impurity doping concentration of first semiconductor layer 35 on VCCD region 31 is different from that of second semiconductor layer 38 on VCCD region 31. The impurity doping concentration of second semiconductor layer 38 on HCCD region 32 is the same as that of second semiconductor layer 38 on VCCD region 31.

Then, as shown in FIG.3d, second semiconductor layer 38 and second insulating layer 37 are patterned to form second vertical poly-gate lines 38a between first vertical poly-gate lines 35a and second horizontal poly-gate lines 38b between first horizontal poly-gate lines 35b.

At this time, second vertical poly-gate line 38a is patterned so as to have a width narrower than that of first vertical poly-gate line 35a. Second horizontal poly-gate line 38b is patterned so as to have the same width as that of first horizontal poly-gate line 35b.

As first and second insulating layers 34 and 37, anyone of an oxide and a nitride is used.

As described above, the method for manufacturing a charge-coupled device of the present invention has the following effect.

According to the widths of the poly-gate I and the poly-gate II on the HCCD region including the VCCD region, the respective impurity doping concentrations are made to be different. Thus, the resistance values according to the doping concentrations and the widths of the poly-gate I and the poly-gate II are the same, thereby enhancing the charge transfer efficiency.

What is claimed is:

1. A method for manufacturing a charge-coupled device, comprising the steps of:

forming a first semiconductor layer on a substrate;

implanting an impurity ion having a first concentration on said first semiconductor layer;

patterning said first semiconductor layer to form a plurality of first gate electrode lines having a first width and spaced apart by a constant distance;

forming a second semiconductor layer on said first gate electrode line and the exposed entire surface of said substrate;

implanting an impurity ion having a second concentration on said second semiconductor layer; and patterning said second semiconductor layer to form second gate electrode lines having a second width between said first gate electrode lines.

2. A method for manufacturing a charge-coupled device as claimed in claim 1, wherein said first and second semiconductor layers are comprised of a polysilicon.

3. A method for manufacturing a charge-coupled device as claimed in claim 1, wherein said first width is narrower than said second width and said first concentration is smaller than said second concentration.

4. A method for manufacturing a charge-coupled device as claimed in claim 1, further comprising the steps of:

forming a first insulating layer for insulating said substrate and said first gate electrodes; and forming a second insulating layer for insulating said first gate electrodes and said second gate electrodes.

5. A method for manufacturing a charge-coupled device of the present invention, comprising the steps of:

(1) forming a plurality of VCCD regions, a HCCD region and the interface region between said VCCD-HCCD regions in the surface of a substrate;

(2) forming a first insulating layer and a first semiconductor layer on the entire surface of said substrate;

(3) performing the first implant doping on the entire surface of said first semiconductor layer;

(4) performing the second impurity doping only on said first semiconductor layer corresponding to said HCCD region and then, patterning said first semiconductor layer of said HCCD region and said VCCD region to form a plurality of first vertical gate electrodes and a plurality of first horizontal gate electrodes;

(5) sequentially forming a second insulating layer and a second semiconductor layer on said first insulating layer and the exposed surface of said gate electrodes and performing the third impurity doping; and (6) patterning said second semiconductor layer to form second vertical gate electrodes between said first gate electrodes and second horizontal gate electrodes between said first horizontal gate electrodes, said second vertical gate electrodes having a width narrower than that of said first vertical gate electrodes and said second horizontal gate electrodes having the same width as that of said first horizontal gate electrodes.

6. A method for manufacturing a charge-coupled device as claimed in claim 5, wherein said gate electrodes are comprised of a polysilicon.

7. A method for manufacturing a charge-coupled device as claimed in claim 5, wherein the sum of said first impurity doping concentration and said second impurity doping concentration is the same as the third impurity doping concentration.

8. A method for manufacturing a charge-coupled device as claimed in claim 5, wherein the impurity doping concentration of said first semiconductor layer on said HCCD region is the same as that of second semiconductor layer on said HCCD region.

9. A method for manufacturing a charge-coupled device as claimed in claim 5, wherein the doping concentration of the impurity implanted in said first vertical gate electrode is not the same as that of the impurity implanted in said second vertical gate electrode.

10. A method for manufacturing a charge-coupled device as claimed in claim 5, wherein said fourth step comprises further the steps of:

exposing only said HCCD region on said first semiconductor layer in which said first impurity doping is completed, using a mask for ion implantation;

performing the second impurity doping on said semiconductor layer on said exposed HCCD region; and patterning said first semiconductor layer.

11. A method for manufacturing a charge-coupled device as claimed in claim 5, wherein said second vertical gate electrode is patterned so as to have a width narrower than that of said first vertical gate electrode.

12. A method for manufacturing a charge-coupled device as claimed in claim 5, wherein said second horizontal gate electrode is patterned so as to have the same width as that of said first horizontal gate electrode.

* * * * *